United States Patent [19]
Nogami

[11] 4,419,179
[45] Dec. 6, 1983

[54] METHOD OF VAPOR PHASE GROWTH

[75] Inventor: Masaharu Nogami, Machida, Japan

[73] Assignee: Fujitsu Limited, Kawasaki, Japan

[21] Appl. No.: 245,668

[22] Filed: Mar. 20, 1981

[30] Foreign Application Priority Data

Mar. 31, 1980 [JP] Japan .................. 55-41740

[51] Int. Cl.³ .................................. C30B 25/10
[52] U.S. Cl. ...................... 156/613; 156/DIG. 70
[58] Field of Search ....... 156/610, 613, 611, DIG. 70; 427/86

[56] References Cited

U.S. PATENT DOCUMENTS

| | | | |
|---|---|---|---|
| 4,007,074 | 2/1977 | Ogirima et al. | 156/610 |
| 4,172,756 | 10/1979 | Hollan | 156/DIG. 70 |
| 4,190,470 | 2/1980 | Walline | 156/611 |

FOREIGN PATENT DOCUMENTS 50-539  9/1975  Japan .................. 156/610

Primary Examiner—Hiram H. Bernstein
Attorney, Agent, or Firm—Staas & Halsey

[57] ABSTRACT

A method of vapor phase growth of GaAs under kinetically limited growth conditions, by which an epitaxial layer of GaAs having an enhanced thickness uniformity can be formed on the surface of a substrate having a large area with good reproducibility. A substrate crystal is placed in a uniform temperature region where the growth temperature $T_D$ (K) is maintained at a level of approximately 650° to approximately 700° C. and GaAs is grown in the uniform temperature region while maintaining the molar fraction (MF) of arsenic in the feed gas within a range of $2.6 \times 10^{11} \exp(-3.1 \times 10^4/T_D) > MF > 1.5 \times 10^{-17} \exp(-4.5 \times 10^4/T_D)$.

5 Claims, 4 Drawing Figures

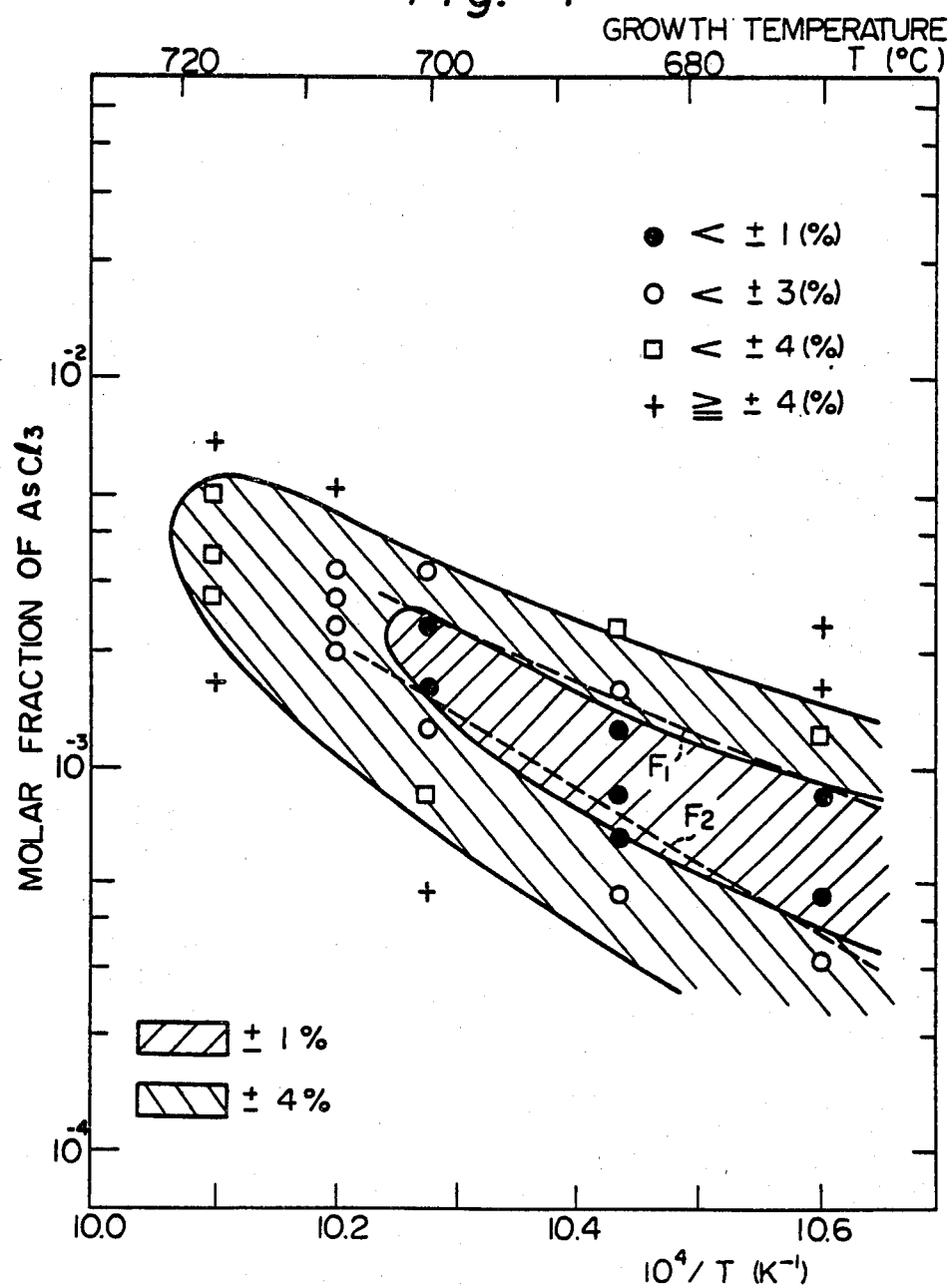

METHOD OF VAPOR PHASE GROWTH

BACKGROUND OF THE INVENTION

1. Field of the Invention

This invention relates to a vapor phase growth method for obtaining a gallium arsenide (GaAs) epitaxial layer having a highly uniform thickness with a good reproducibility.

2. Description of the Prior Art

The vapor phase growth method is a method for growing a thin film layer of a single crystal on a single crystal substrate and this method is widely used in the production of semiconductor elements. GaAs is used as a material of various semiconductor elements, such as field effect transisters and Gunn diodes. The method of the vapor phase growth of GaAs is important for the manufacture of these semiconductor elements. With recent demands for mass production of GaAs elements, improvement of the reliability of performances of semiconductor elements and the increase of integration in circuits, a technique of forming an epitaxial layer having an improved uniformity on a substrate of a large area with a good reproducibility has eagerly been desired. A method of the epitaxial growth of continuous multi-layer structures is ordinarily adopted for production of GaAs elements. In order to obtain such continuous multi-layer epitaxial growth elements at an enhanced yield, it is necessary to grow an epitaxial layer having a high thickness uniformity with a good reproducibility.

In most conventional methods for forming epitaxial layers of GaAs for semiconductor elements, the growth is carried out generally under diffusion limited conditions. In the growth carried out under diffusion limited conditions, the thickness distribution of the eptaxial layer formed on the crystal surface of the substrate is considerably influenced by growth conditions, such as the growth temperature, the flow rate of the feed gas, the molar fraction of $AsCl_3$ and the temperature gradient in the vicinity of the substrate. Therefore, it is necessary to carry out the growth while controlling these growth conditions very precisely. Accordingly, in the conventional methods, the reproducibility is poor and it is very difficult to obtain an epitaxial layer having a high thickness uniformity. In the growth carried out under the above-mentioned conditions, since a boundary layer formed on the crystal surface of the substrate controls the thickness distribution of the epitaxial layer, it is very difficult to grow an epitaxial layer having a highly uniform thickness on the crystal surface of a substrate having a large area.

As another instance of the vapor phase growth method, there is known a method in which the growth is carried out under kinetically limited growth conditions, and according to this method, a substrate is placed in a uniform or constant growth temperature region. This growth method is advantageous over the growth conducted under diffusion limited conditions. The growth rate is hardly influenced even if the mole number of molecules in the reaction gas and flow rate of the gas are changed more or less. The boundary layer also has no influence on the thickness distribution and if the uniform growth temperature region is sufficiently long, an epitaxial layer having a uniform thickness can be formed on the crystal surface of a substrate having a large area. The growth in this region, however, is carried out at a temperature lower than the temperature adopted for the growth under diffusion limited conditions, and the degrees of supersaturation of the vapor phase is increased by lowering the growth temperature. Accordingly, a polycrystalline GaAs is deposited on the wall of the reaction tube upstream of the substrate crystal or in the vicinity thereof, with the result that the reproducibility among growth runs is poor and it is difficult to obtain an epitaxial layer having a highly uniform thickness.

SUMMARY OF THE INVENTION

It is therefore a primary object of the present invention to provide a method of the vapor phase growth of GaAs by which the foregoing problems involved in the conventional methods can be solved and an epitaxial layer of GaAs having such a high thickness uniformity (defined hereinafter) as falling within approximately ±1% can be formed on the crystal surface of a substrate having a large area with a good reproducibility.

In accordance with the present invention, there is provided a method of the vapor phase epitaxial growth of GaAs under kinetically limited growth conditions, which comprises placing a substrate crystal in a uniform temperature region where the growth temperature $T_D$ (K) is maintained at a level of approximately 650° to approximately 700° C. and growing GaAs in the uniform temperature region while maintaining the molar fraction (MF) of arsenic in the feed gas within a range of $2.6 \times 10^{11} \exp(-3.1 \times 10^4/T_D) > MF > 1.5 \times 10^{-17} \exp(-4.5 \times 10^4/T_D)$.

BRIEF DESCRIPTION OF THE DRAWINGS

FIG. 4 is a diagram illustrating the influence of the growth temperature and the molar fraction of $AsCl_3$ on the thickness uniformity of the grown GaAs layer.

DESCRIPTION OF THE PREFERRED EMBODIMENTS

Figure 1:
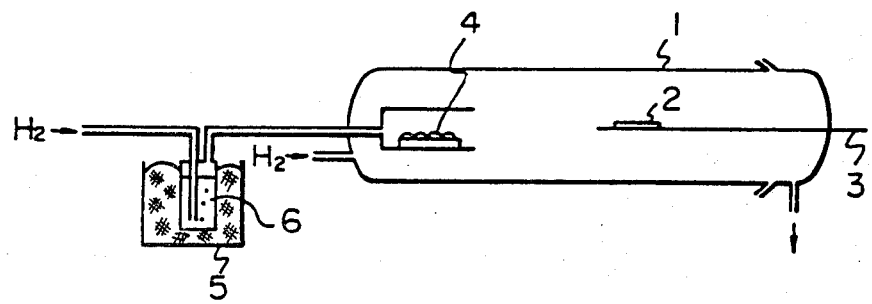
FIG. 1 is a view diagrammatically illustrating a vapor phase growth apparatus used in an embodiment of the present invention.

The growth rate in the vapor phase growth of GaAs varies depending upon the temperature of the substrate, that is, the growth temperature, and the growth rate has a peak value at a certain temperature. Namely, the growth rate tends to decrease if the growth temperature is elevated beyond this critical temperature or lowered below this critical temperature, and this peak value varies depending on the molar fraction MF value, but is ordinarily located at a temperature higher than approximately 720° C. It is considered that the epitaxial growth is advanced under diffusion limited growth conditions at a temperature higher than this peak value temperature and under kinetically limited growth conditions at a temperature lower than this peak value temperature. Vapor phase growth of GaAs is ordinarily carried out at temperatures higher to some extent than this critical temperature giving the peak value of the growth rate in most conventional methods.

In order to obtain a vapor phase growth layer of GaAs having a uniform thickness with a good reproducibility at lower temperatures, that is, under kinetically limited growth conditions, the molar fraction of arsenic in the reaction gas is very important. For example, in order to maintain the epitaxial layer thickness uniformity within approximately ±1% on a wafer having a relatively large area of 20 cm$^2$, it now has been found that it is sufficient under kinetically limited growth conditions, that is, at a temperature lower than approximately 700° C., if the molar fraction (MF) of arsenic in the gaseous feed is maintained within a range of from $1.5 \times 10^{17} \exp(-4.5 \times 10^4/T_D)$ to $2.6 \times 10^{11} \exp(-3.1 \times 10^4/TD)$ in which $T_D$ represents the growth temperature.

More specifically, as the molar fraction MF of arsenic is increased beyond the value determined according to an approximate equation of $MF = 2.6 \times 10^{11} \exp(-3.1 \times 10^4/T_D)$, the degree of supersaturation of molecules in the reaction gas is increased and polycrystalline GaAs is caused to be deposited on the wall of a reaction tube upstream of the substrate crystal and in the vicinity thereof, with the result that substantial reduction of the molar fraction is caused because of a shortage of molecular species in the reaction gas and the growth becomes a diffusion limited growth. Accordingly, the thickness uniformity of the epitaxial growth layer is reduced and the reproducibility is degraded.

When the molar fraction (MF) of arsenic is decreased below the value determined according to an equation of $MF = 1.5 \times 10^{17} \exp(\times 4.5 \times 10^4/T_D)$, the proportion of the diffusion limited growth is increased with a reduction of the molar fraction of arsenic, resulting in degradation of the thickness uniformity.

Accordingly, in the vapor phase growth of GaAs conducted at temperatures lower than approximately 700° C., by maintaining the molar fraction (MF) of arsenic within the range of from $1.5 \times 10^{17} \exp(-4.5 \times 10^4/T_D)$ to $2.6 \times 10^{11} \exp(-3.1 \times 10^4/T_D)$ an epitaxial growth layer which has a high thickness uniformity as within approximately ±1% can be formed on a substrate having a large area.

If the growth temperature is lower than approximately 700° C., the growth can be carried out under kinetically limited conditions, but if the growth temperature is lower than approximately 650° C., the density of the deep level impurity is increased and the quality of the formed crystal is degraded. Accordingly, the growth temperature should preferably be in the range of from approximately 650° to approximately 700° C.

As the carrier gas, there is advantageously used hydrogen or a mixed gas of hydrogen and an inert gas such as nitrogen.

A preferred embodiment of the present invention will now be described in detail.

Referring to FIG. 1 diagrammatically illustrating a GaAs vapor phase growth apparatus used in this embodiment, a GaAs substrate 2 having an area of approximately 20 cm$^2$ is placed on a holer 3 within a quartz reaction tube 1. A hydrogen (H$_2$) carrier gas is blown into a bath 6 of arsenic trichloride (AsCl$_3$) maintained in a thermostat tank 5. The arsenic trichloride-carrying hydrogen is introduced into the reaction tube in which a gallium (G$_a$) source 4 is placed. A hydrogen gas is separately allowed to flow into the reaction tube 1 in order to adjust the molar fraction of arsenic in the gaseous feed.

The gallium source 4 comprises a plurality of sections formed in one boat, and each section is filled with a melt of gallium. The entire gallium source 4 is heated at 800° C., while the GaAs substrate 2 is placed in a uniform temperature region maintained at 685° C.

The flow rate of the H$_2$ gas through the AsCl$_3$ bath 6 is 600 ml/min, and the flow rate of the H$_2$ gas flowing directly into the reaction tube 1 is 4000 ml/min. The gas is discharged from the right hand end of the reaction tube 1 in FIG. 1. Before the growth, "in situ" etching is carried out according to conventional procedures. It is preferred that the molar fraction of As be controlled by changing the temperature of the AsCl$_3$ bath 6 rather than by changing the flow rate of the carrier gas. In this case, if the temperature is set at 15° C., the molar ratio of AsCl$_3$ is $8.4 \times 10^{-4}$. Accordingly, the thermostatic tank 5 should preferably be such that the temperature can be set within a range of 0° to 37° C.

Figure 2:
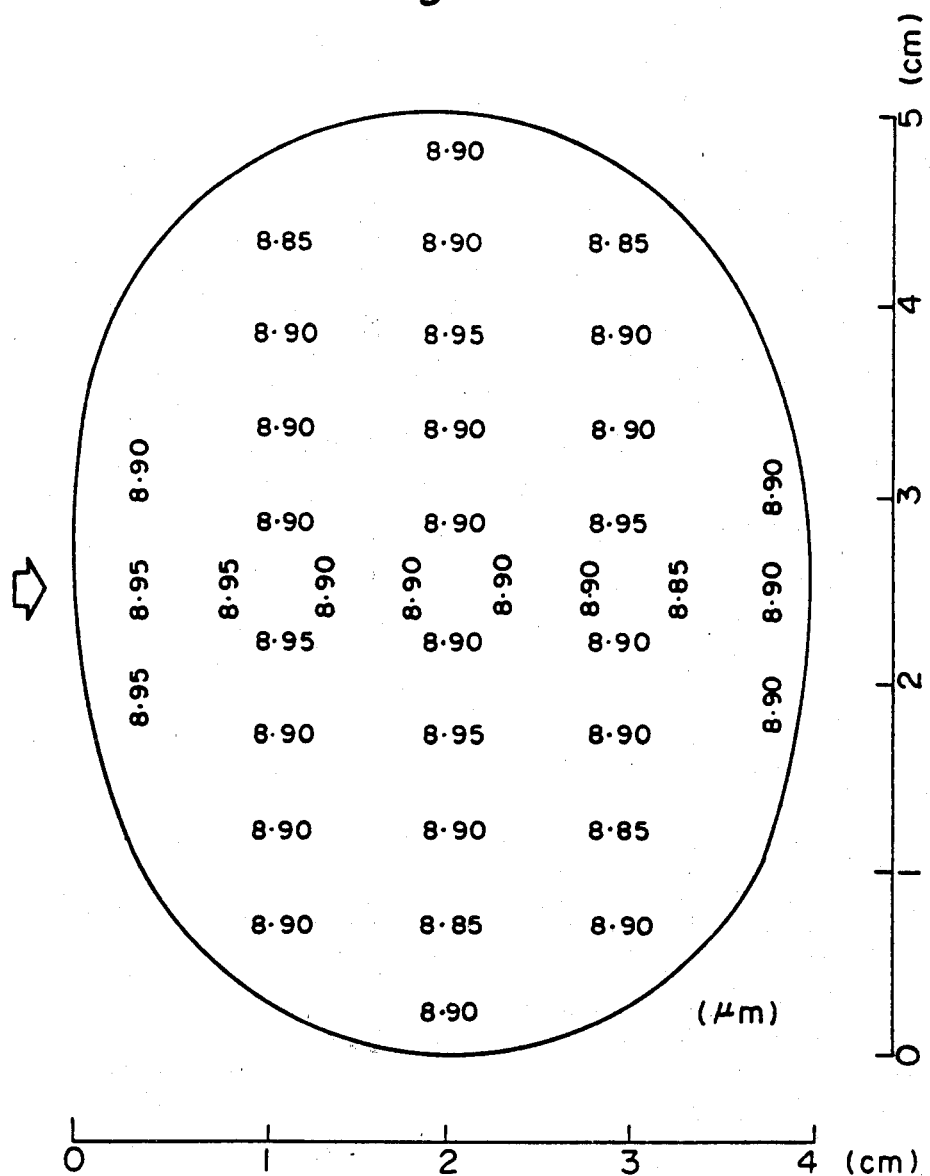
FIG. 2 is a diagram illustrating the thickness distribution of the grown GaAs layer at respective positions of the wafer.

The vapor phase epitaxial growth was carried out under the above conditions for 60 minutes. The in-plane thickness distribution of the obtained epitaxial layer on a wafer is as shown in FIG. 2, wherein the numerals signify thickness in microns (μm). The maximum value, minimum value and mean value of the thickness are 8.95 μm, 8.85 μm and 8.91 μm, respectively, and the thickness uniformity was evaluated according to the following equation.

Thickness uniformity $$(\%) = \frac{\text{maximum thickness} - \text{minimum thickness}}{\text{mean thickness}} \times 100$$

Figure 3:
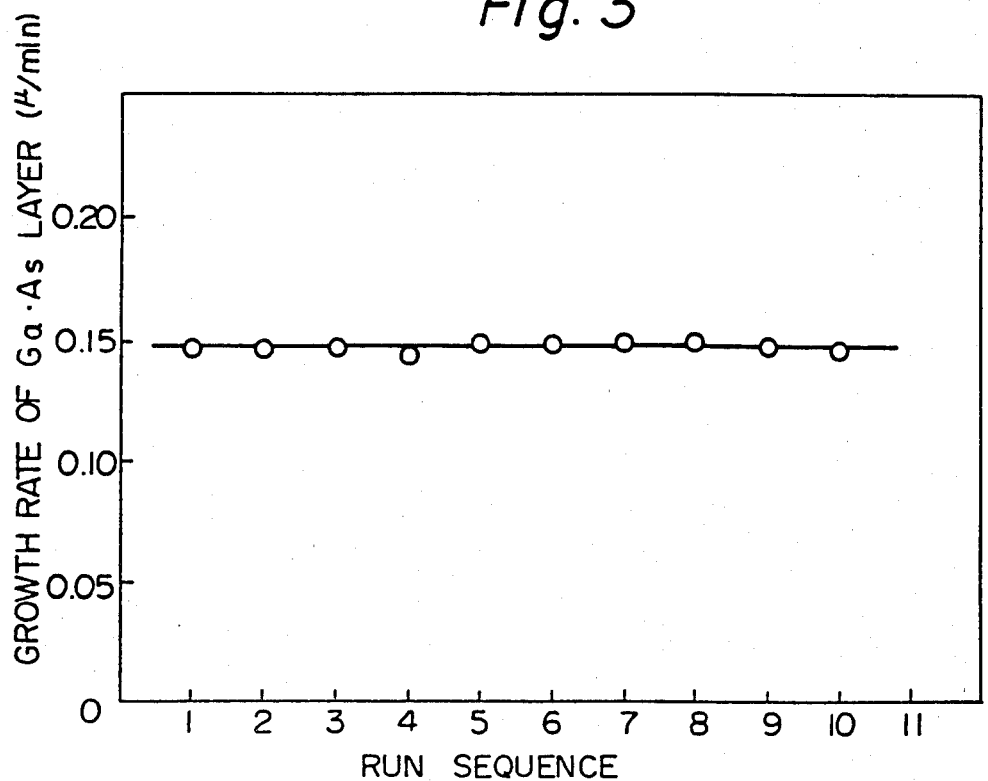
FIG. 3 is a diagram illustrating the reproducibility in successive growth of the GaAs layer

The so determined thickness uniformity of the epitaxial layer obtained in this embodiment was ±0.6%. Thus, it is confirmed that an epitaxial layer having a very high thickness uniformity can be obtained. The growth was repeated ten times in succession to examine the reproducibility. The obtained results are shown in FIG. 3, wherein the ordinate indicates the growth rate of the GaAs layer in microns/minute and the abscissa indicates the run sequence.

In each run, an epitaxial layer having a high thickness uniformity wthin ±1% was obtained, and the reproducbility was within ±2%.

An epitaxial layer was grown on a GaAs substrate crystal having an area of 20 cm$^2$ under the same conditions as described above except that the molar fraction (MF) of AsCl$_3$ and the growth temperature were changed, and the thickness uniformity was examined to obtain the results shown in FIG. 4. In FIG. 4, the ordinate signifies the molar fraction of AsCl$_3$ in the gaseous feed and the abscissa signifies the growth temperature in T(°C.) and $10^4/T(K^{-1})$. The region hatched by lines inclined downwardly to the left in FIG. 4 is the region in which the thickness uniformity is within ±1%, and the region hatched by lines inclined downwardly to the right is the region in which the thickness uniformity is within ±4%.

Since FIG. 4 is a semi-logarithm graph, if the dotted line F$_1$ in FIG. 4 is expressed by the relation formula of $A\exp(B/T_D)$ in which A and B are constants, the dotted line F$_1$ is expressed as $F_1 = 2.57 \times 10^{11} \exp(-3.14 \times 10^4/T_D)$, and the lower dotted line F$_2$ is similarly expressed as $F_2 = 1.47 \times 10^{17} \exp(-4.48 \times 10^4/T_D)$. A high uniformity falling within ±1% can be obtained in the range surrounded by the lines F$_1$ and F$_2$ in FIG. 4.

In the above embodiment, the epitaxial growth of GaAs was according to the AsCl$_3$−Ga−H$_2$ system. However, Ga may be fed in the form of GaCl in the present invention. Actually, in the foregoing embodiment, it is believed that the gallium source 4 reacts with AsCl$_3$ and is practically converted to GaCl. Furthermore, GaAs may be used as the Ga source 4. In the foregoing embodiment, it is considered that a GaAs crust layer is formed on the surface of the Ga source 4 by reaction with AsCl$_3$. Moreover, a single substance of As or an arsenic compound, such as arsenic hydride (AsH$_3$) may be used instead of AsCl$_3$ in the present invention.

It should be appreciated that the invention has been described above with particular reference to the preferred embodiments thereof, but variations and modifications can be made thereto within the scope and equivalents of the invention presented in the claim.

What is claimed is:

1. A method of vapor phase epitaxial growth of gallium arsenide (GaAs) under kinetically limited growth conditions comprising the steps of: placing a substrate monocrystal in a uniform temperature region where a growth temperature $T_D$ (K) is maintained at a level of approximately 650° to 700° C. and growing GaAs in said uniform temperature region while maintaining the molar fraction (MF) of arsenic in a feed gas within a range of $2.6 \times 10^{11} \exp(-3.1 \times 10^4/T_D) > MF > 1.5 \times 10^{-17} \exp(-4.5 \times 10^4/T_D)$.

2. A method according to claim 1 wherein the feed gas comprises a carrier gas comprised of hydrogen or a mixed gas of hydrogen and an inert gas, said carrier gas carrying arsenic or an arsenic compound generated from an arsenic source and gallium or a gallium compound generated from a gallium source.

3. A method according to claim 2 wherein the arsenic source is comprised of arsenic, arsenic chloride or arsenic hydride and the gallium source is comprised of gallium, gallium chloride or gallium arsenide.

4. The method of claim 2 or 3 wherein the molar fraction of arsenic is maintained by regulating the temperature of the arsenic source.

5. The method of claim 4 wherein the arsenic source is an AsCl$_3$ bath and the temperature of said bath is approximately within the range of 0° to 37° C.

* * * * *

UNITED STATES PATENT AND TRADEMARK OFFICE
CERTIFICATE OF CORRECTION

PATENT NO. : 4,419,179

DATED : Dec. 6, 1983

INVENTOR(S) : Nogami

It is certified that error appears in the above-identified patent and that said Letters Patent is hereby corrected as shown below:

```
Column 2, line 41, "growth" should be --growths--;
Column 2, line 41, after "layer" insert --; and--;
Column 3, line 29, "(x4.5" should be --(-4.5--.
Column 5, line 15, "claim" should be --claims--.
```

Signed and Sealed this

Twenty-sixth Day of June 1984

[SEAL]

Attest:

GERALD J. MOSSINGHOFF

Attesting Officer

Commissioner of Patents and Trademarks